(12) United States Patent
Lell et al.

(10) Patent No.: US 8,737,445 B2
(45) Date of Patent: May 27, 2014

(54) LASER DIODE ASSEMBLY

(71) Applicant: OSRAM Opto Semiconductors GmbH, Regensburg (DE)

(72) Inventors: Alfred Lell, Maxhuette-Haidhof (DE); Soenke Tautz, Tegernheim (DE); Uwe Strauss, Bad Abbach (DE); Clemens Vierheilig, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/857,103

(22) Filed: Apr. 4, 2013

(65) Prior Publication Data
US 2013/0343419 A1 Dec. 26, 2013

Related U.S. Application Data (60) Provisional application No. 61/620,354, filed on Apr. 4, 2012.

(51) Int. Cl.
*H01S 5/00* (2006.01)
(52) U.S. Cl.
USPC ............................... 372/50.1; 372/36; 372/34
(58) Field of Classification Search
USPC ............................................. 372/50.1, 36, 34
See application file for complete search history.

(56) References Cited

U.S. PATENT DOCUMENTS

| 3,136,932 | A | 6/1964 | Trent |
| 6,590,920 | B1 | 7/2003 | McElhinney et al. |
| 2010/0124246 | A1 * | 5/2010 | Lutgen et al. ................ 372/50.1 |
| 2010/0303110 | A1 * | 12/2010 | Bhagavatula et al. .......... 372/22 |
| 2011/0057220 | A1 | 3/2011 | Mochida et al. |
| 2012/0033698 | A1 | 2/2012 | Morizumi |
| 2012/0057612 | A1 * | 3/2012 | Yoshida et al. ............ 372/49.01 |
| 2012/0326178 | A1 * | 12/2012 | Fehrer et al. .................... 257/88 |

FOREIGN PATENT DOCUMENTS

| DE | 10 2005 053 274 A1 | 4/2007 |
| JP | 2560131 B2 | 12/1996 |
| JP | 2001-135745 A | 5/2001 |

(Continued)

OTHER PUBLICATIONS

Carcia, P.F., et al., "Gas diffusion ultrabarriers on polymer substrates using $Al_2O_3$ atomic layer deposition and SiN plasma-enhanced chemical vapor deposition," Journal of Applied Physics, No. 106, 2009, 6 pages.

(Continued)

*Primary Examiner* — Kinam Park
(74) *Attorney, Agent, or Firm* — Slater & Matsil, L.L.P.

(57) ABSTRACT

A laser diode assembly includes a housing having a housing part and a mounting part, which is connected to the housing part and which extends away from the housing part along an extension direction. A laser diode chip is disposed on the mounting part. The laser diode chip has, on a substrate, semiconductor layers with an active layer for emitting light. The housing part and the mounting part have a main body composed of copper and at least the housing part is steel-sheathed. A first solder layer having a thickness of greater than or equal to 2 μm is arranged between the laser diode chip and the mounting part. The laser diode chip has a radiation coupling-out area, on which a crystalline protective layer is applied.

17 Claims, 7 Drawing Sheets

(56) References Cited

FOREIGN PATENT DOCUMENTS

| JP | 2004-006824 A | 1/2004 |
|---|---|---|
| JP | 2005-019973 A | 1/2005 |
| JP | 2005-101073 A | 4/2005 |
| JP | 2006-135219 A | 5/2006 |
| JP | 2011-151080 A | 8/2011 |
| WO | WO 2011/073027 A1 | 6/2011 |

OTHER PUBLICATIONS

Eichler, C., "Thermisches Management GaN-basierter Laserdioden," Cuvillier Verlag Göttingen, 2006, ISBN 3-86537-754-8, pp. 132-133 and 136-137.

Hirvikorpia, T., et al., "Enhanced water vapor barrier properties for biopolymer films by polyelectrolyte mulitlayer and atomic layer deposited $Al_2O_3$ double-coating," Applied Surface Science, vol. 257, 2011, pp. 9451-9454.

Johansson, P., "Atomic Layer Deposition Process for Barrier Applications of Flexible Packaging," downloaded from http://www.tappi.org/content/events/10PLACE/pagpes/johansson.pdf, Apr. 18-21, 2010, 21 pages.

Lutgen, S., et al., "Recent results of blue and green InGaN laser diodes for laser projection," Proc. SPIE, vol. 7953, 2011, pp. 79530G1-12.

Ritala, M., et al., "Atomic layer deposition," Handbook of Thin Film Materials, vol. 1: Deposition and Processing of Thin Films, Academic Press, 2002, ISBN 0-12-512909-2/535.00, pp. 103-159.

Sizov, D., et al., "Gallium Indium Nitride-Based Green Lasers," IEEE Journal of Lightwave Technology, vol. 30, No. 5, Mar. 1, 2012, pp. 679-699.

Sizov, D., et al., "Carrier Transport in InGaN MQWs of Aquamarine- and Green-Laser Diodes," IEEE Journal of Selected Topics in Quantum Electronics, vol. 17, No. 5, Sep./Oct. 2011, pp. 1390-1401.

Strauss, U., et al., "Pros and cons of green InGaN laser on c-plane GaN," Phys. Status Solidi B, vol. 248, 2010, pp. 652-657.

Vierheilig, C., et al., "Beyond blue pico laser: development of high power blue and low power direct green," Proc. SPIE, vol. 8277, Novel In-Plane Semiconductor Lasers XI, Feb. 9, 2012, pp. 82770K-1-82770K-7.

\* cited by examiner

LASER DIODE ASSEMBLY

This application claims the benefit of U.S. Provisional Application No. 61/620,354, filed on Apr. 4, 2012. This application is related to German Patent Application No. 10 2012 102 305.0, filed on Mar. 19, 2012. Both of these applications are incorporated herein by reference.

TECHNICAL FIELD

A laser diode assembly is specified.

BACKGROUND

Light sources having a high optical power density are key components for a multiplicity of applications. By way of example, laser diodes composed of a nitride-based compound semiconductor material system have a high market potential for projection systems, in particular those having luminous fluxes of between 1,000 and 10,000 lumens.

Therefore, components having high output power and compact housings are required for such applications. For cost reasons and in the context of standardization, housings of the so-called TO type series (TO: "transistor outline") in the form of TO metal housings ("TO metal can") are customary, for instance in the form of the known structural sizes TO38, TO56 and TO90, wherein the TO metal housings are substantially manufactured from steel. However, currently available laser diodes in such standard TO designs, also designated hereinafter as "TO housings" for short, have been limited heretofore to optical powers of less than 3 watts, which is insufficient for many applications. To date, however, it has not yet been possible to achieve optical powers of more than 3 watts with such designs.

By way of example, the document C. Vierheilig, et al., Proc. SPIE, vol. 8277, 82770K, 2012, discloses blue-emitting nitride-based laser diodes in TO housings which, at room temperature in continuous wave operation, can emit light having a wavelength in the range of 440 nm to 460 nm with an output power of a maximum of 2.5 watts.

SUMMARY OF THE INVENTION

Specific embodiments specify a laser diode assembly.

In accordance with at least one embodiment, a laser diode assembly comprises a housing, in which a laser diode chip is arranged. The housing has, in particular, a housing part and a mounting part, which is connected to the housing part and which extends away from the housing part along an extension direction. In other words, the mounting part projects away from the housing part and can be embodied in a pin-type fashion, for example. The mounting part has a mounting area, which extends away from the housing part along the extension direction of the mounting part and on which the laser diode chip is arranged. The housing part can be provided and designed, in particular, for making it possible to arrange a housing cover for closing the housing on the housing part.

The housing part and the mounting part, which can, in particular, also be embodied integrally with one another, each have a main body composed of copper or else, in the case of an integral embodiment, a common main body composed of copper. At least the housing part is furthermore steel-sheathed. That means that the housing part is substantially formed from the copper of the main body and is covered with a steel layer. The steel layer can be formed by a layer composed of high-grade steel, for example.

Furthermore, the housing part can have holes or openings, for example, through which electrical leads for example in the form of contact legs can project from that side of the housing part which faces away from the mounting part to the side on which the mounting part is arranged. The electrical leads can be provided for making electrical contact with the laser diode chip, for example via a wire connection between an electrical lead and the laser diode chip.

In accordance with a further embodiment, in addition to the housing part, the mounting part is also steel-sheathed. In particular, in this embodiment, the housing part and the mounting part can have a common copper main body covered with a steel layer.

In particular, the housing can be embodied as a so-called TO housing, for example, having a structural size TO38, TO56 or TO90. The housing part can also be designated as "base plate," and the mounting part as "stem." In comparison with standard TO housings which are usually used and which have at least one housing part or a housing part and a mounting part which substantially consist of steel and do not have a copper-based main body, the housing described here has a higher thermal conductivity on account of the copper of the steel-sheathed housing part.

In accordance with a further embodiment, the housing has a housing cover, which is applied on the housing part and is welded to the housing part. For this purpose, it is particularly advantageous that the housing part is steel-sheathed since as a result, as in the case of a standard TO housing having a steel base, the housing cover can be welded to the housing part. The mounting part projects into the housing cover from the housing part along its extension direction, such that the laser diode chip, with the housing cover mounted, is situated on the mounting part in the cavity formed by the housing cover and the housing part. The housing cover furthermore has a window on a side facing away from the housing part, through which window the light emitted by the laser diode chip during operation can be emitted from the laser diode assembly. The housing cover can comprise, for example, steel, in particular high-grade steel, or be composed thereof apart from the window. As a result of the housing part being welded to the housing cover, which is embodied in the form of a cap above the mounting part and thus also above the laser diode chip on the mounting part, the housing can be hermetically or at least very tightly closed.

In accordance with a further embodiment, the laser diode chip is arranged on the mounting part by means of a first solder layer. That means, in particular, that the first solder layer is arranged between the laser diode chip and the mounting part. The first solder layer has a thickness of greater than or equal to 2 µm. Particularly, the thickness of the solder layer can also be greater than or equal to 3 µm and furthermore also greater than or equal to 5 µm.

The laser diode chip can be mounted directly on the mounting part by means of the first solder layer. As an alternative thereto, it is also possible for a heat-conducting element, which is embodied as a so-called heat spreader, to be arranged between the laser diode chip and the mounting part. The heat-conducting element can serve, in particular, to expand or spread the heat flow between the laser diode chip and the mounting part, in order to achieve a large transfer area during heat transfer into the housing, that is to say in particular the mounting part. Furthermore, it can also be possible that the heat-conducting element can compensate, for example, for strains between the laser diode chip and the housing which can be brought about, for example, by different coefficients of thermal expansion thereof.

In accordance with a further embodiment, the heat-conducting element is fixed on the mounting part by means of the first solder layer. The laser diode chip is fixed on the heat-conducting element by means of a second solder layer. By way of example, the second solder layer can also have a thickness of greater than or equal to 2 µm, preferably of greater than or equal to 3 µm and particularly preferably of greater than or equal to 5 µm. Features and advantages described in connection with the first solder layer can also apply to the second solder layer, and vice versa.

In accordance with a further embodiment, the heat-conducting element comprises silicon carbide (SiC), boron nitride (BN), copper-tungsten (CuW) or diamond or consists thereof. Silicon carbide, boron nitride, copper-tungsten and diamond can be distinguished by a particularly high thermal conductivity. As an alternative thereto, the heat-conducting element can also comprise aluminum nitride.

In the case of the laser diode assembly described here, therefore, between the main body of the copper-based mounting part and the laser diode chip, which usually have different coefficients of thermal expansion, there may be situated one or more materials having likewise different coefficients of thermal expansion, in particular the first solder layer and furthermore, for example, a steel sheathing of the mounting part and/or one or more further solder layers and/or a heat-conducting element. As a result, during operation, thermally induced strains can form between the laser diode chip and the housing or between the laser diode chip and the heat-conducting element and also between the heat-conducting element and the housing, which strains can adversely affect the operation of the laser diode assembly. While it is customary in the prior art to keep the thickness of a solder layer by means of which a laser diode chip is mounted as thin as possible, in particular below 2 µm, in order to achieve the best possible heat dissipation, in the case of the laser diode assembly described here the first solder layer, and, if appropriate, also the second solder layer, is used with a preferably considerably larger thickness. The higher thermal resistance of such a solder layer is accepted here since such a thick solder layer can prove to be advantageous for compensating for thermally induced strains between the housing and the laser diode chip. By way of example, a solder layer described here can comprise an indium-based soft solder in order to be able to compensate particularly well for different thermal expansions. In the case of the laser diode assembly described here, therefore, it is possible to use materials such as silicon carbide, boron nitride, copper-tungsten or diamond as heat-conducting element, which have a higher thermal conductivity in comparison with aluminum nitride but also have significantly more different coefficients of thermal expansion in comparison with the customary materials for laser diode chips.

As described further above, in comparison with the use of a standard TO housing composed of high-grade steel, the use of a housing, for example, of a TO housing, which is based on copper or has a copper core and a steel surface, taken by itself, does not result in an improvement in the laser power. Moreover, the use of a solder layer having a thickness of greater than or equal to 2 µm also appears to be counterproductive owing to the higher thermal resistance. It has been found, however, that in the case of the laser diode assembly described here, as a result of the combination of the housing described here with the thick first solder layer, it is possible to achieve a higher optical output power in the range of a plurality of watts, in particular of more than 3 W, and also a higher conversion efficiency of the electrical input power into optical output power.

In accordance with a further embodiment, the laser diode chip is based on a nitride compound semiconductor material. The laser diode chip can comprise, in particular, a substrate, preferably an electrically conductive substrate, for example, crystalline (In, Al, Ga)N. Thereabove an epitaxial layer sequence, that is to say epitaxially grown semiconductor layers, can be applied, which is based on a nitride compound semiconductor material and is thus embodied on the basis of InAlGaN.

InAlGaN-based compound semiconductor materials, (In, Al,Ga)N-based compound semiconductor materials and nitride compound semiconductor materials include, in particular, those which comprise a material from the III-V compound semiconductor material system $In_xAl_yGa_{1-x-y}N$ where $0 \leq x \leq 1$, $0 \leq y \leq 1$ and $x+y \leq 1$, that is to say for example GaN, AlN, AlGaN, InGaN, AlInGaN. The laser diode chip can have, in particular, on the substrate a semiconductor layer sequence having an active layer, particularly preferably on the basis of AlGaInN and/or InGaN, which is provided for emitting light during operation. In particular, the laser diode chip can emit light from an ultraviolet to green wavelength range during operation.

In accordance with a further embodiment, the laser diode chip has semiconductor layers on the substrate, said semiconductor layers having, for example, the active layer between waveguide layers and cladding layers. In particular, it is possible to apply on the substrate a first cladding layer, thereabove a first waveguide layer, thereabove the active layer, thereabove a second waveguide layer and above the latter a second cladding layer. Above the second cladding layer, it is furthermore possible to arrange a semiconductor contact layer and, above the latter, an electrical connection layer, for example, in the form of a metal layer. Electrical contact can be made with the laser diode chip particularly preferably via the electrical connection layer situated opposite the substrate and also via the conductive substrate, wherein the substrate can also have an electrical connection layer on the side facing away from the semiconductor layers. On that side of the active layer which faces away from the substrate, a charge carrier barrier layer can furthermore be arranged between the waveguide layer and the cladding layer in order to avoid a so-called charge carrier overshoot.

By way of example, the semiconductor layers arranged between the substrate and the active layer can be n-doped and the semiconductor layers arranged above the active layer as seen from the substrate can be p-doped. As an alternative thereto, it is also possible to reverse the doping order. The active layer can be undoped or n-doped. The laser diode chip can have as active layer for example a conventional pn junction, a double heterostructure or a quantum well structure, particularly preferably a multiquantum well structure (MQW structure). In the context of this application, the designation quantum well structure encompasses, in particular, any structure in which charge carriers can experience a quantization of their energy states as a result of confinement. In particular, a quantum well structure can have quantum wells, quantum wires and/or quantum dots and a combination of these structures. By way of example, the active layer can have InGaN-based quantum films between suitably embodied barrier layers.

In accordance with a further embodiment, the laser diode chip has a radiation coupling-out area, via which the light generated in the active layer is emitted during operation. The laser diode chip is preferably embodied as an edge-emitting laser diode chip, in which the radiation coupling-out area can be produced, for example, by breaking, cleaving and/or etching a semiconductor layer composite assemblage along a crystal plane. Furthermore, the laser diode chip has a rear side area arranged opposite the radiation coupling-out area. In particular, a region of a front side area of the laser diode chip via which the coherent light generated in the laser diode chip is emitted can be designated as the radiation coupling-out area. The front side area, in particular also the radiation coupling-out area, and the rear side area are usually also designated as so-called facets in the case of edge-emitting laser diode chips. Furthermore, the laser diode chip has side areas which connect the rear side area and the radiation coupling-out areas to one another and which are formed by the sides of the semiconductor layers in a direction perpendicular to the growth and arrangement direction of the semiconductor layers.

In accordance with a further embodiment, the laser diode chip has a crystalline protective layer at least on the radiation coupling-out area. Here and hereinafter "crystalline" layer denotes a layer having in its entirety a crystalline structure, that is to say a short-range and a long-range order. In contrast thereto, an amorphous layer has only a short-range order and a part-crystalline or partially crystalline layer also has a long-range order only in parts or regions, but said long-range order is not continued over the entire layer.

In particular, the crystalline protective layer can be hermetically impermeable, in particular hermetically impermeable in the region of the radiation coupling-out area, that is to say preferably the region of the front side area of the laser diode chip via which the laser radiation is emitted during operation. In this case, a hermetically impermeable layer can have, in particular, an impermeability which is high enough that the area of the laser diode chip which is covered by the hermetically impermeable layer is protected during the lifetime of the laser diode chip and of the laser diode assembly in such a way that no damage that shortens the lifetime occurs. In particular, the crystalline protective layer can have a higher impermeability than, for example, an amorphous or a partially crystalline layer. This can be based, for example, on the fact that the crystalline layer is preferably embodied without lattice defects, so-called "pin holes," which can bring about leakages.

The crystalline protective layer can protect the areas of the laser diode chip which are covered by the crystalline protective layer, that is to say at least the radiation coupling-out area, against environmental influences such as, for instance, damaging gases. Such environmental influences can be formed, for example, by oxygen, ozone, substances contained in acid rain, and other chemicals. For example, when the laser diode assembly is used as a light source in automotive engineering, the laser diode chip and in particular the radiation coupling-out area thereof can be jeopardized in the case of an unprotected laser diode chip on account of aggressive media such as, for instance, hydrocarbons and sulfur and nitrogen compounds, for example, hydrogen sulfide and sulfur and nitrogen oxides. Such damaging environmental influences can penetrate into the housing of the laser diode assembly as far as the laser diode chip, for example, when the housing itself is not sealed hermetically impermeably relative to the surroundings. In the case of the housing of the laser diode assembly described here, on account of the different coefficients of thermal expansion there is a particular technical challenge, when closing the housing, in welding the housing based on copper or on steel-sheathed copper to a steel-based housing cover with a sufficient impermeability. Particularly in the high-volume manufacture of such components, an increase in the escape rate of components having a residual leakage can occur. Although it is known to provide the facets of laser diode chips with coatings, the latter are usually amorphous to partially crystalline and, on account of their gray boundaries and imperfections, can prevent the diffusion of facet-damaging materials only to an insufficient extent. The crystalline protective layer thus constitutes an additional protection—ensuring reliable use of the laser diode assembly—of, in particular, the critical radiation coupling-out area.

Furthermore, the thick solder layers described here between the laser diode chip and the housing, for example, the first solder layer, can have the effect that solder particles migrate via the surfaces of the laser diode chip, in particular in regions of the laser facets. Without a sufficiently impermeable facet coating, the solder particles can diffuse through the facet coating, which can lead to leakage currents via the laser facets. The crystalline protective layer described here can ensure a sufficiently impermeable facet coating which can prevent damage to the laser diode chip caused by solder particles. By means of the crystalline protective layer, in the case of a crystalline dielectric material, it is additionally possible to achieve a significant increase in the breakdown field strength, whereby it is possible to achieve protection against electrical breakdown, for example on account of a solder layer running up or a p-type metallization hanging over the facet.

In particular, in one particularly advantageous embodiment, the laser diode assembly comprises the above-described copper-based housing with the laser diode chip, wherein the first solder layer having a thickness of greater than or equal to 2 µm is arranged between the laser diode chip and the mounting part, and wherein the laser diode chip has a radiation coupling-out area, on which a crystalline protective layer is arranged. As a result of the combination of these features, which are at odds with improved heat removal in the case of the thick solder layer, for example, improved heat dissipation and thus a higher output power can nevertheless be achieved for the laser diode assembly. As a result, it is possible to ensure a significant increase in the optical output power by means of an optimum combination of low strain of the laser diode chip, good heat transfer from the laser diode chip and a high component reliability.

In accordance with a further embodiment, the laser diode chip is provided with the crystalline protective layer at least on the radiation coupling-out area during the production of the laser diode assembly. For this purpose, an application method is used by means of which a crystalline dielectric, semiconducting or conducting layer can be produced. By way of example, it is possible to choose a method for chemical vapor deposition (CVD) at elevated temperatures, in particular at temperatures of greater than or equal to 500° C. and preferably of greater than or equal to 600° C. Particularly preferably, the crystalline protective layer can also be implemented by deposition by means of an atomic layer deposition (ALD) method, in particular an atomic layer epitaxy (ALE) method. The atomic layer deposition methods, too, can be carried out at elevated temperatures—in comparison with customary methods for producing facet coatings—of greater than or equal to 500° C. and preferably of greater than or equal to 600° C., in order to obtain the crystalline protective layer. What is advantageous about the methods mentioned, in particular an atomic layer deposition method, is the defect-free, "pin hole"-free structure, a good adhesion on surfaces, a high stability, a good overforming even of unevennesses with a high aspect ratio, and a low-strain structure. What is particularly advantageous in the case of such protective layers is the low permeability thereof toward gases, for example, oxygen or moist air, as described, for example, in the documents P. F.

Carcia, et al., Journal of Applied Physics 106, 023533 (2009) and T. Hirvikorpia, Applied Surface Science 257, 9451-9454 (2011).

In accordance with a further embodiment, the crystalline protective layer has exactly one crystalline layer. As an alternative thereto, it is also possible for the crystalline protective layer to have a plurality of crystalline layers. The plurality of crystalline layers can be formed, for example, by a plurality of crystalline layers composed of different materials. Furthermore, it is also possible for the plurality of crystalline layers to be formed by an alternating sequence of at least two crystalline layers composed of different materials.

In accordance with a further embodiment, an optical layer is applied on the radiation coupling-out area. The optical layer can be, for example, a reflective or antireflective layer. Such optical layers usually have one and preferably a plurality of layers composed of transparent materials which can form a periodic sequence of different refractive indices.

By way of example, the crystalline protective layer can form the optical layer. This can be advantageously possible in particular when the crystalline protective layer has a plurality of crystalline layers. As an alternative thereto, it is also possible for an optical layer to be applied in addition to the crystalline protective layer, which optical layer need not necessarily be crystalline, but rather can be, for example, amorphous or partially crystalline. In this case, the optical layer can be applied by means of a conventional application method such as is known from the prior art for facet coatings.

The optical layer can be arranged between the radiation coupling-out area and the crystalline protective layer, for example, and can be covered by the crystalline protective layer. This can make it possible that, in addition to the radiation coupling-out area, the optical layer is also protected by the crystalline protective layer. As an alternative thereto, it is also possible for the crystalline protective layer to be arranged between the radiation coupling-out area and the optical layer. In this case, the crystalline protective layer is advantageously arranged as near as possible and particularly preferably directly on the laser diode chip, that is to say at least on the radiation coupling-out area. In combination with an additional optical layer, the crystalline protective layer can also have a part of the optical functionality of the coating and thus be a part of the optical layer.

In accordance with a further embodiment, the crystalline protective layer is formed by a dielectric material or at least comprises a dielectric material. Particularly, in the case of a direct and immediate coating of the radiation coupling-out area and, if appropriate, further areas of the laser diode chip, a dielectric layer is advantageous since short circuits of the laser diode chip can thereby be avoided. In combination with an optical layer or else a passivation layer between the crystalline protective layer and the laser diode chip, the crystalline protective layer can also comprise a semiconducting or conducting material or be composed thereof.

Particularly, the crystalline protective layer can be formed by an oxide or at least comprise an oxide. By virtue of the oxygen of the oxidic material, hydrogen bridge bonds can be formed with water molecules, for example, whereby the water molecules can be prevented from penetrating into the crystalline layer. Particularly preferably, the oxide can be dielectric.

Particularly, the crystalline protective layer can comprise in one or in a plurality of crystalline layers one or a plurality of the following materials: $Al_2O_3$, $Si_3N_4$, $Nb_xAl_yO_z$, $Al_2O_3/TiO_2$, $Al_2O_3/Ta_2O_5$, $HfO_2$, $Ta_2O_5/ZrO_2$, $Ta_2O_5$, $Ta_xTi_yO_z$, $Ta_2O_5/NbO_5$, $TiO_2$, $ZrO_2$, $HfO_2$, $Ta_2O_5$, $Nb_2O_5$, $Sc_2O_3$, $Y_2O_3$, $MgO$, $B_2O_3$, $SiO_2$, $GeO_2$, $La_2O_3$, $CeO_2$, $PrO_x$, $Nd_2O_3$, $Sm_2O_3$, $EuO_x$, $Gd_2O_3$, $Dy_2O_3$, $Ho_2O_3$, $Er_2O_3$, $Tm_2O_3$, $Yb_2O_3$, $Lu_2O_3$, $SrTiO_2$, $BaTiO_3$, $PbTiO_3$, $PbZrO_3$, $Bi_xTi_yO$, $Bi_xSi_yO$, $SrTa_2O_6$, $SrBi_2Ta_2O_9$, $YScO_3$, $LaAlO_3$, $NdAlO_3$, $GdScO_3$, $LaScO_3$, $LaLuO_3$, $Er_3Ga_5O_{13}$, $HfSiO$, $HfTiO$, $AlSiO$, $LaAlO$, $LaHfO$, $In_2O_3$, $ZnO$, $Ga_2O_3$, $V_2O_5$, $HfAlO$, $HfTaO$, $HfZrO$, Ru, Pt, Ir, Td, Rh, Ag, W, Cu, Co, Fe, Ni, Mo, Ta, Ti, Al, Si, Ge, $In_2O_3$, $In_2O_3$:Sn, $In_2O_3$:F, $In_2O_3$:Zr, $SnO_2$, $SnO_2$:Sb, ZnO:Al, ZnO:B, ZnO:Ga, $RuO_2$, $RhO_2$, $IrO_2$, $Ga_2O_3$, $V_2O_5$, $WO_3$, $W_2O_3$, BN, AlN, GaN, InN, $SiN_x$, $Ta_3N_5$, $Cu_3N$, $Zr_3N_4$, $Hf_3N_4$, NiO, CuO, $FeO_x$, $CrO_x$, $CoO_x$, $MnO_x$, TiN, $Ti_xSi_yN_z$, NbN, TaN, $Ta_3N_5$, $MoN_x$, $W_2N$, GaAs, AlAs, AlP, InP, GaP, InAs, TaC.

In accordance with a further embodiment, a crystalline protective layer is likewise applied on the rear side area of the laser diode chip situated opposite the radiation coupling-out area. The facets of the laser diode chip that are sensitive toward environmental influences can be effectively protected by the crystalline protective layer on the radiation coupling-out area and also on the rear side area.

Furthermore, an optical layer, in particular a reflective layer, can also be applied on the rear side area. As described further above for the coating of the radiation coupling-out area, it is possible on the rear side area, too, to arrange the optical layer between the crystalline protective layer and the rear side area. As an alternative thereto, the crystalline protective layer can also be arranged between the optical layer and the rear side area. It can also be particularly advantageous if the optical layer on the rear side area of the laser diode chip is formed by the crystalline protective layer.

In accordance with a further embodiment, one or more crystalline protective layers are applied on side areas of the laser diode chip that connect the rear side area and the radiation coupling-out area. In particular, it can be advantageous if a crystalline protective layer is applied on all side areas arranged perpendicular to the growth and arrangement direction of the semiconductor layers and also on the facets of the laser diode chip, such that the semiconductor layers and the interfaces between semiconductor layers are protected all around.

BRIEF DESCRIPTION OF THE DRAWINGS

Further advantages, advantageous embodiments and developments will become apparent from the exemplary embodiments described below in conjunction with the figures.

In the Figures:

FIGS. 6 to 7C show schematic illustrations of laser diode assemblies in accordance with further exemplary embodiments.

In the exemplary embodiments and figures, elements that are identical, of identical type or act identically may in each case be provided with the same reference signs. The illustrated elements and their size relationships among one another should not be regarded as true to scale; rather, individual elements such as, for example, layers, structural parts, components and regions may be illustrated with an exaggerated size in order to enable better illustration and/or in order to afford a better understanding.

DETAILED DESCRIPTION OF ILLUSTRATIVE EMBODIMENTS

Attempts have been made to increase the optical output power by increasing the dimension of the optical resonator, that is to say in particular the chip area, since a long-term aging behavior dependent on current density has been found in the case of nitride-based laser diodes, as described, for example, in the document S. Lutgen, et al., Proc. SPIE, vol. 7953, page 79530G1-12, 2011. Moreover, increasing the active area also makes it possible to improve the heat transport from the light-generating layer in the direction of a heat sink.

Figure 1A:
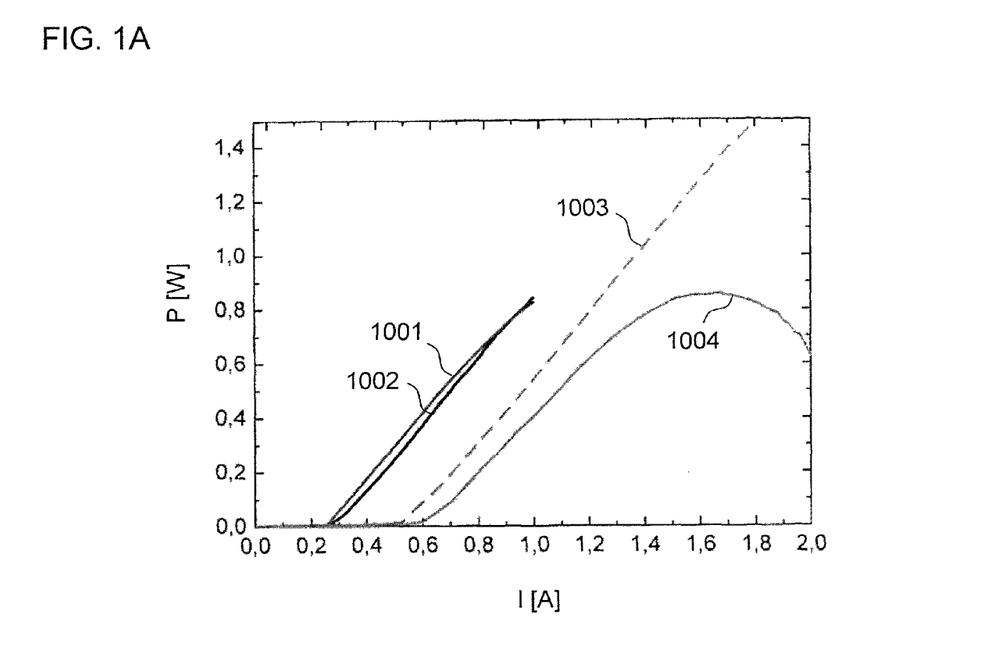
FIGS. 1A and 1B show measurements of properties of conventional laser diode assemblies.

The inventors of the present application have discovered in their own investigations and studies, however, that increasing the chip area does not lead to an increase in power. In this respect, FIG. 1A shows, for blue-emitting laser diode chips based on a nitride compound semiconductor material, measurements of the optical output power P (in watts) as a function of the operating current I (in amperes). The laser diode chips used for the measurement were in this case each situated in a TO housing. For two individual chips each having a component size of 200 μm×1200 μm and an active area of 15 μm×1200 μm, the measurement curves 1001 and 1002 were determined. In order to achieve higher powers, the above-described approach for doubling the chip area was investigated. The increase in power expected from such doubling is indicated in the form of the dashed line 1003. It has been found, however, that, contrary to expectations, the achievable maximum power with doubled chip area is even lower still than in the case of the individual chips, as can be seen from the curve 1004 for a laser diode chip having a doubled active area in comparison with the previously described individual chips.

Alongside the standard TO housings composed of high-grade steel, TO housings are also known which, for the purpose of better heat dissipation, have a housing part which is based on copper or has a copper core and a steel surface, as described, for example, in German Patent Publication No. DE 1184870, and which are intended to lead to an improvement in the heat dissipation from laser diode chips on account of the copper having good thermal conductivity.

Figure 1B:
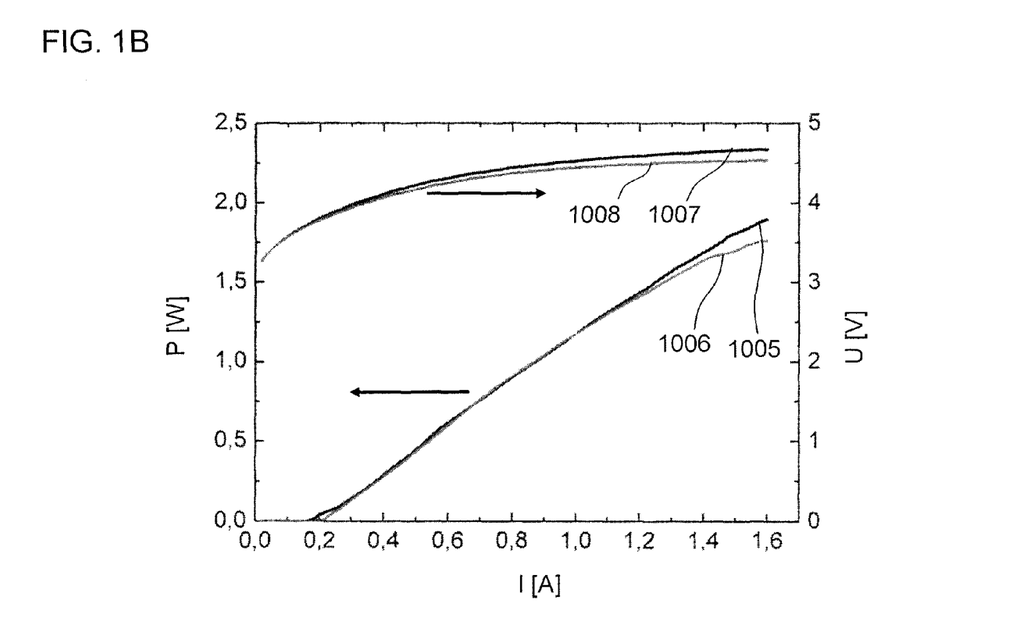

FIG. 1B shows, on the basis of investigations by the inventors, measurements of the optical output power P (in watts) and of the operating voltage U (in volts) of laser diode chips in different TO housings as a function of the operating current I (in amperes). The curves 1005 and 1007 show the current-dependent optical power and the associated operating voltage of a blue-emitting GAN laser diode chip in a customary TO56 standard housing having a steel base ("base plate") and a copper mounting part ("stem"), while the curves 1006 and 1008 show corresponding measurements for a laser diode chip in an alternative TO56 housing having a steel-sheathed copper base and a steel-sheathed copper mounting part. As can readily be discerned, the alternative housing having a base that is based on steel-sheathed copper does not lead straightforwardly to an improvement in the maximum power of the laser diode chips. Therefore, the approach of such alternative TO housings has not been pursued further by any laser diode manufacturer for nitride-based laser diodes.

Figure 2A:
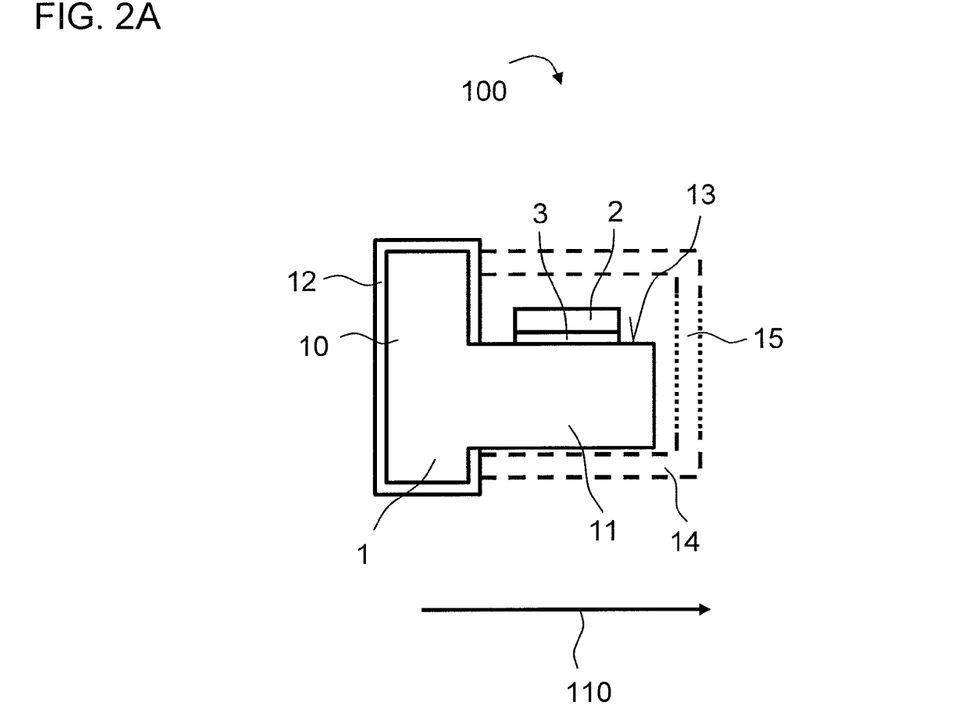
FIGS. 2A and 2B show schematic illustrations of a laser diode assembly in accordance with an exemplary embodiment.
Figure 2B:
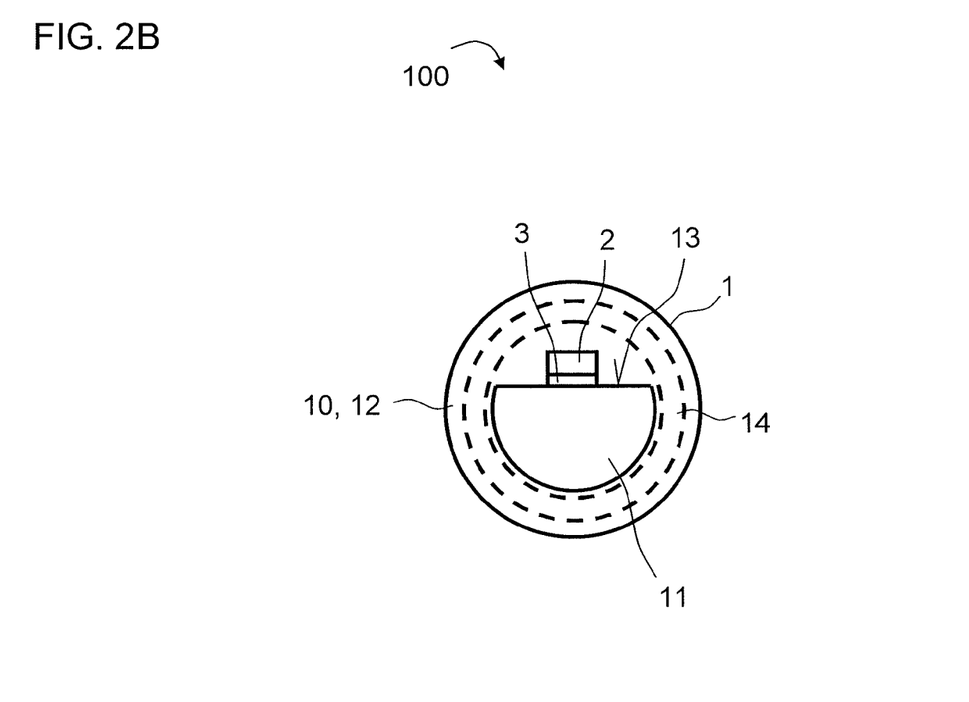

FIGS. 2A and 2B show an exemplary embodiment of a laser diode assembly 100, wherein FIG. 2A shows a schematic sectional illustration and FIG. 2B a plan view of the front side of the laser diode assembly 100 counter to the direction 110 shown in FIG. 2A. The following description relates equally to FIGS. 2A and 2B.

The laser diode assembly 100 comprises a housing 1 embodied in the form of a so-called TO housing. The housing 1 has a housing part 10 and a mounting part 11 arranged at the housing part. The mounting part 11 extends away from the housing part 10 along the extension direction 110 and is embodied integrally with the housing part 10 in the exemplary embodiment shown. For this purpose, the housing part 10 and the mounting part 11 have a main body formed from copper. The housing part 10 furthermore has a sheathing 12 composed of steel, which is formed by a coating of the copper main body in the region of the housing part 10.

Furthermore, the housing part 10 can have holes or openings, for example, in which are arranged small lead legs projecting from that side of the housing part 10 which faces away from the mounting part 11 to the side of the mounting part 11. Small lead legs arranged and fixed therein can be embodied as electrical feedthroughs, for example, and afford possibilities for electrical contact-making.

The mounting part 11 has a mounting area 13, on which a laser diode chip 2 is arranged. In particular, the laser diode chip 2 is mounted on the mounting area 13 of the mounting part 11 by means of a first solder layer 3, and is thereby electrically and thermally connected to the housing 1.

A housing cover 14 can be arranged above the mounting part 11 and thus above the laser diode chip 2, said housing cover being indicated by the dashed lines. The housing cover 14, which can furthermore have a window 15, can comprise steel, for example, and preferably be composed of steel apart from the window 15. By virtue of the fact that the housing part 10 has the steel sheathing 12, the housing cover 14 can be applied on the housing part 10 of the housing 1 and, as in customary TO housings having steel bases, can be fixed by means of welding in a standard process.

While it is customary for the purpose of optimum heat dissipation in standard laser diode components to couple a laser diode chip to a housing via a solder layer that is as thin as possible, in order to obtain a thermal resistance that is as low as possible, the first solder layer 3 in the exemplary embodiment shown here has a thickness of greater than or equal to 2 μm and preferably of greater than or equal to 3 μm. The thickness of the first solder layer 3 can particularly preferably also be greater than or equal to 5 μm. It is thereby possible to compensate for thermally induced stresses that occur during operation as a result of the heat generated in the laser chip 2 and the different coefficients of thermal expansion of the laser diode chip 2 and of the housing 1. Furthermore, by way of example, surface unevennesses on the mounting area 13 of the mounting part 11 can also be compensated for by such a thick solder layer. Said unevennesses can in particular also occur if the mounting part 11, as is shown below in FIG. 6, has a sheathing 12 composed of steel like the housing part 10.

Figure 3:
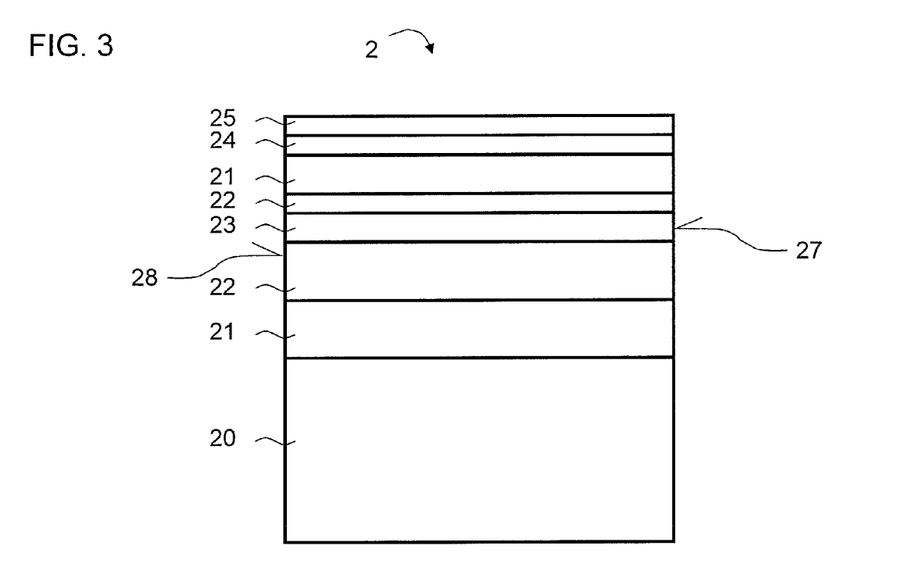
FIG. 3 shows a schematic illustration of a laser diode chip in accordance with an exemplary embodiment.

Preferably, as is shown in FIG. 3, the laser diode chip 2 is formed as an edge-emitting laser diode chip having a radiation coupling-out area 27 formed by a side area and a rear side area 28 situated opposite the radiation coupling-out area. The radiation coupling-out area 27 can be formed, in particular, by that region of the front side area of the laser diode chip 2 via which the laser radiation generated in the laser diode chip 2 is emitted during operation.

In particular, the laser diode chip 2 is based on a nitride compound semiconductor material. For this purpose, the laser diode chip 2 has a substrate 20, which is preferably embodied as electrically conducting and, for example, comprises crystalline (In, Al, Ga)N or is composed thereof. A semiconductor layer sequence based on a nitride compound semiconductor material is grown thereabove, preferably by means of an epitaxy method such as, for example, metal organic vapor phase epitaxy (MOVPE). The laser diode chip 2 has, on the substrate 20, an active layer 23 arranged between waveguide layers 22 and cladding layers 21. In particular, the laser diode chip 2 has a first cladding layer 21 on the substrate 20, on which first cladding layer a first waveguide layer 22 and thereabove the active layer 23 are arranged. Above the active layer 23 there follow in the growth direction a further waveguide layer 22 and also a further cladding layer 21 and thereabove a semiconductor contact layer 24, with which contact is made by an electrical connection layer 25, for example in the form of a metallic electrode layer. The laser diode chip 2 is electrically connected via the electrical connection layer 25 and the electrically conducting substrate 20, which can have a further electrical connection layer (not shown) on the side facing away from the semiconductor layers 21, 22, 23 and 24.

In the exemplary embodiment shown, as seen from the active layer 23, the semiconductor layers facing the substrate 20 are n-doped, while the semiconductor layers arranged on that side of the active layer 23 which faces away from the substrate 20 are p-doped. Alternatively, an opposite doping order is also possible. The active layer 23 can be n-doped or undoped, for example, and can have a multiquantum well structure, in particular, in the exemplary embodiment shown.

Figure 4:
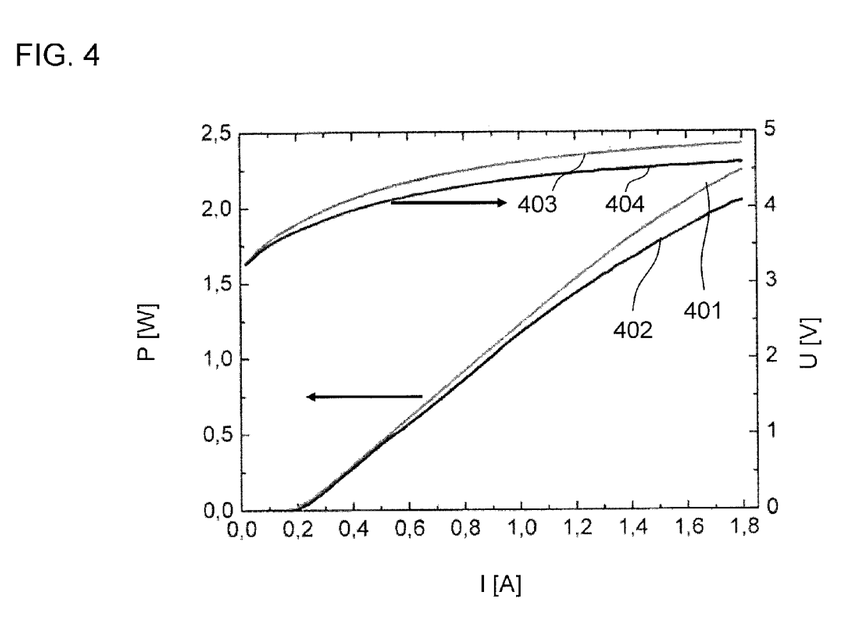
FIG. 4 shows measurements of properties of laser diode assemblies.

In particular, an improved thermal conductivity in comparison with a standard TO housing composed of steel is achieved by means of the copper-based housing 1. In FIG. 4, in this respect, the curves 401 and 402 show the optical output power P (in watts) and the curves 403 and 404 show the operating voltage U (in volts) in each case as a function of the operating current I (in amperes) for blue-emitting GaN-based laser diode chips, wherein laser diode chips in standard TO56 housings having a base composed of steel and laser diode chips in copper-based housings described here having a housing part composed of steel-sheathed copper, mounted by means of a solder layer thickness of approximately 5 µm, were investigated. A comparison of the curves 401 and 403 for the case of the copper-based housing described here and the thick solder layer with the curves 402 and 404 for the case of the standard TO housing and a thin solder layer shows, despite a higher thermal resistance of the thicker solder, an improvement in the output power when using the housing described here with the first solder layer 3 described here.

In accordance with further exemplary embodiments, the laser diode chip 2 has a crystalline protective layer 6 at least on the radiation coupling-out area 27, as described below in conjunction with FIGS. 5A to 5G, which show exemplary embodiments of the laser diode chip 2 which can be mounted in a housing 1 of the laser diode assemblies described here by means of a partially shown solder layer. The layer construction of the laser diode chip 2 is not shown in the subsequent figures, for the sake of clarity.

The laser diode chip 2 of the following exemplary embodiments has, at least on a radiation coupling-out area 27, a crystalline protective layer 6 that is suitable and provided for protecting at least the radiation coupling-out area 27 against damaging environmental influences, for example caused by the ambient air. Such damaging environmental influences in the ambient air can be, for example, oxygen, ozone, acid rain, sulfur and sulfur compounds and nitrogen oxides and hydrocarbons and other damaging chemicals. Such substances may possibly also penetrate undesirably into a housing 1 closed with a housing cover 14, since, on account of the different coefficients of thermal expansion between copper and steel, there is a particular technical challenge in connecting and welding a steel-based housing cover 14 to the housing part 10 sufficiently impermeably. In particular in high-volume manufacture of such housings 1, an increase in an unidentified proportion of components having a residual leakage can occur. Therefore, the crystalline protective layer 6 may be required for reliable use of the laser diode chip 2 in a housing 1 having high thermal conductivity described here, as additional protection of at least the radiation coupling-out area 27.

In particular, the crystalline protective layers 6 described below can be hermetically impermeable and thus have an impermeability that is high enough for the laser diode chip 2 to be sufficiently protected over its entire lifetime. The crystalline protective layers 6 in accordance with the following exemplary embodiments can be applied to the laser diode chip 2, for example, by means of an atomic layer deposition method, in particular by means of an atomic layer epitaxy method, or by means of a chemical vapor deposition method, in particular at temperatures of greater than or equal to 500° C. and preferably of greater than or equal to 600° C. Protective layers 6 applied by means of atomic layer deposition, in particular, advantageously form a crystal-defect-free, so-called "pin hole"-free structure having a good adhesion to surfaces, a high stability, a good overforming and a low-strain structure.

Furthermore, by virtue of the thick first solder layer 3 and, if appropriate, also by virtue of a thick second solder layer 5, as explained in conjunction with FIGS. 7A to 7C, an increased supply of solder can be present below the laser diode chip 2, which can have the effect that solder particles can migrate up to the laser diode chip 2 and in particular to the radiation coupling-out area 27 and can diffuse through a non-hermetically impermeable facet coating, which can lead to leakage currents via the radiation coupling-out area 27. Protection against diffusion of solder to the surface of the laser diode chip 2 can thus also be achieved by means of the crystalline protective layer 6. Furthermore, in the case of a dielectric material, the crystalline protective layer 6 can bring about a significant increase in the breakdown field strength.

Figure 5A:
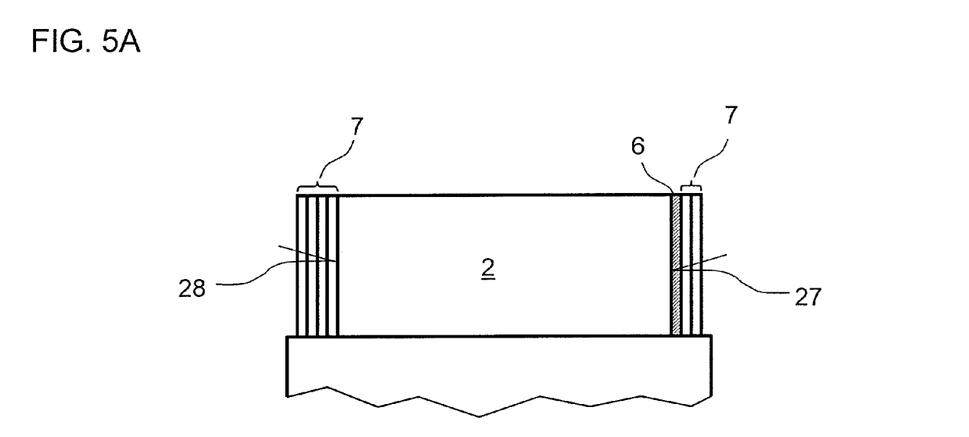
FIGS. 5A to 5G show schematic illustrations of parts of laser diode assemblies in accordance with further exemplary embodiments.

FIG. 5A shows an exemplary embodiment of a laser diode chip 2 in a sectional illustration, in which a crystalline protective layer 6 is applied directly on the radiation coupling-out area 27 of the laser diode chip 2. For this purpose, the crystalline protective layer 6 comprises a dielectric material, for example, one of the dielectric materials mentioned above in the general part. As an alternative thereto, it may also be possible for a dielectric passivation layer to be arranged between the crystalline protective layer 6 and the radiation coupling-out area 27, such that a semiconducting or conducting material, as described above in the general part, can also be used for the crystalline protective layer 6.

Furthermore, optical layers 7 in the form of layer stacks which are embodied as antireflective coating or reflective coating of the respective laser facet are applied on the radiation coupling-out area 27 and also on the rear side area 28 situated opposite the radiation coupling-out area 27. By way of example, the optical layer 7 applied on the radiation coupling-out area 27 can be embodied as an antireflective layer, while the optical layer 7 applied on the rear side area 28 is embodied as a reflective layer. The optical layers 7 can be applied by means of a method which is customary for the coating of laser diode facets and which produces typically amorphous or partially crystalline layers.

In the exemplary embodiment shown, the crystalline protective layer 6 is thus arranged between the optical layer 7 and the radiation coupling-out area 27. In order to protect the radiation coupling-out area 27, it can be sufficient if the crystalline protective layer 6 has a thickness of from a few nanometers to a few tens of nanometers, such that the crystalline protective layer 6 has no influence on the optical properties of the coating applied on the radiation coupling-out area 27, which are then substantially determined by the optical layer 7. As an alternative thereto, it is also possible for the crystalline protective layer 6 to be embodied as part of the optical layer 7 and to have an appropriately chosen thickness.

Figure 5B:
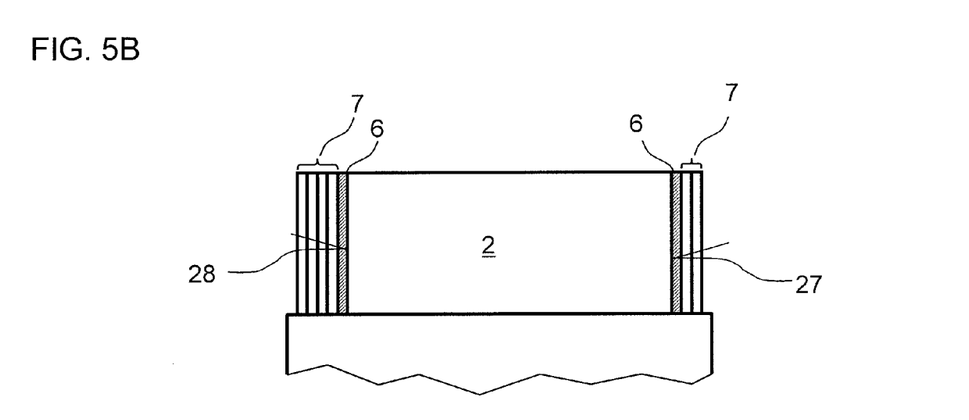

FIG. 5B shows an exemplary embodiment in which, in addition to the crystalline protective layer 6 on the radiation coupling-out area 27, on the rear side area 28, too, a crystalline protective layer 6 is arranged between the rear side area 28 and the optical layer 7. As a result, the rear side area 28 can also be protected both against damaging gases and against solder possibly migrating or diffusing to the rear side area 28.

Figure 5C:
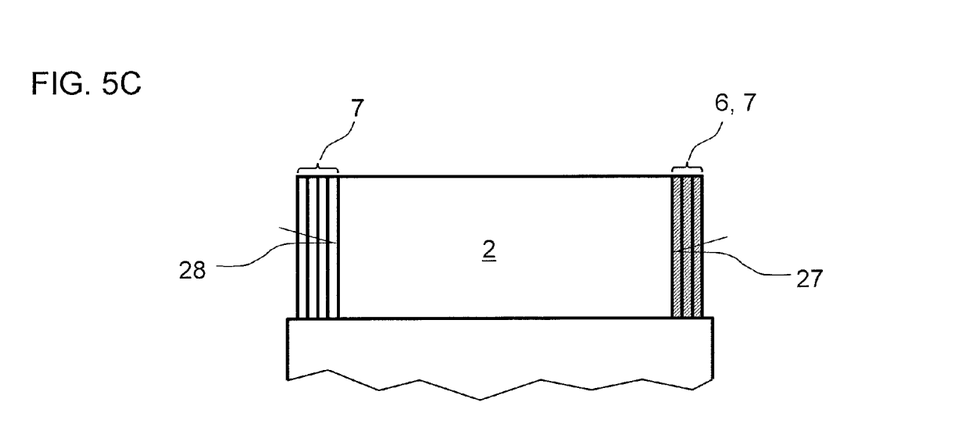

FIG. 5C shows a further exemplary embodiment, in which the optical layer 7 on the radiation coupling-out area 27 is formed by the crystalline protective layer 6. For this purpose, the crystalline protective layer 6 has one and preferably a plurality of layers composed of different materials having the desired antireflective or reflective properties.

Figure 5D:
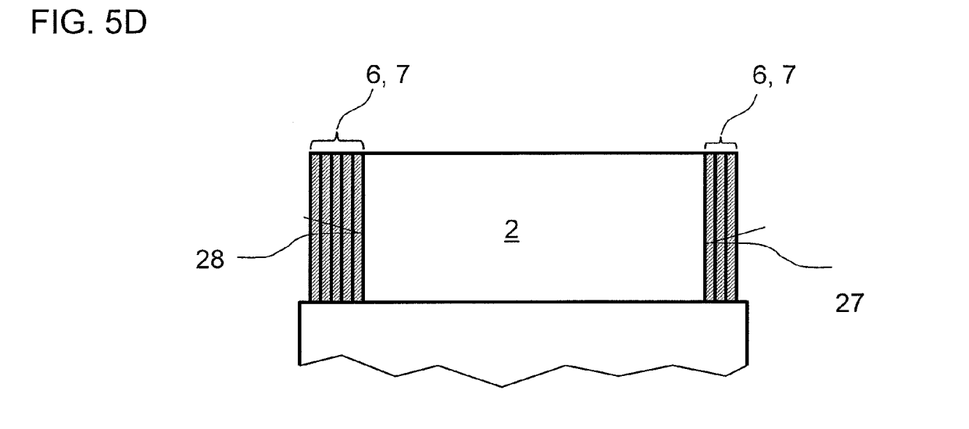

FIG. 5D shows a further exemplary embodiment, in which the optical layer 7 on the rear side area 28 is also formed by a crystalline protective layer 6. In this case too, the crystalline protective layers 6 can each have one and preferably a plurality of crystalline layers composed of different materials which lead to the desired antireflective or reflective property.

Figure 5E:
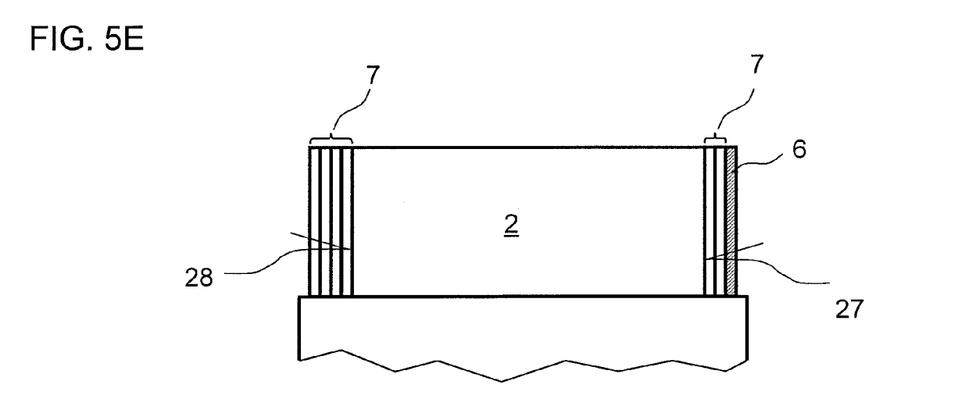

FIG. 5E shows a further exemplary embodiment, in which, in comparison with the exemplary embodiment in FIG. 5A, the crystalline protective layer 6 is applied on the optical layer 7, such that the optical layer 7 is arranged between the crystalline protective layer 6 and the radiation coupling-out area 27 and is thus covered by the crystalline protective layer 6. As a result, firstly the optical layer 7 in addition to the radiation coupling-out area 27 can be protected by the crystalline protective layer 6. Furthermore, it is also possible, as an alternative to a dielectric material, also to use a semiconducting material or a conducting material, for example, one of the materials mentioned above in the general part, for the crystalline protective layer 6.

Figure 5F:
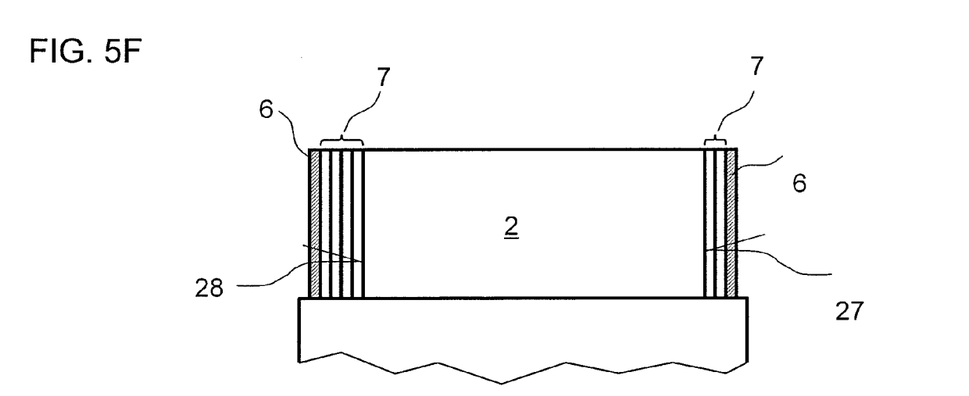

In the exemplary embodiment in FIG. 5F, a crystalline protective layer 6 is also applied on the optical layer 7 on the rear side area 28, which protective layer can protect the rear side area 28 and also the optical layer 7 on the rear side area 28.

Figure 5G:
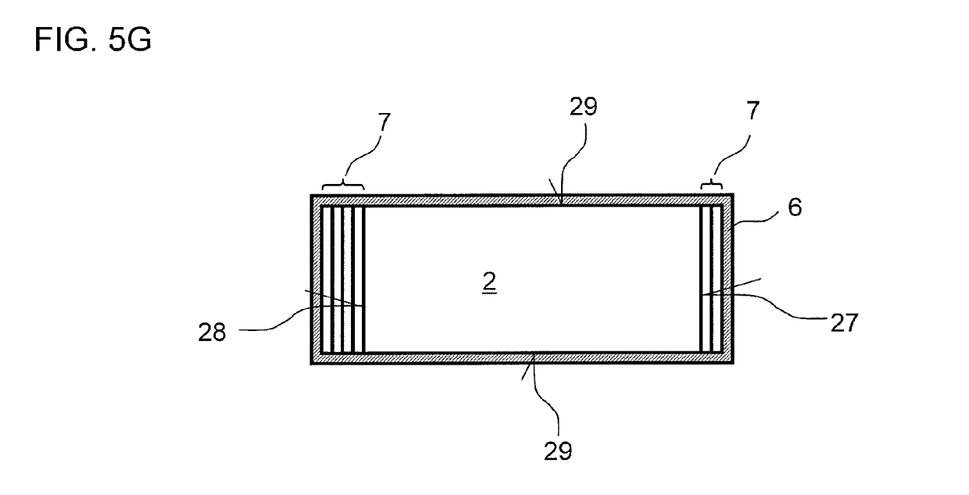

FIG. 5G shows a further exemplary embodiment, which shows the laser diode chip 2 in a plan view from above and in which, in addition to the crystalline protective layer 6 on the radiation coupling-out area 27 and the rear side area 28, a crystalline protective layer 6 is applied on the side areas 29 that connect the rear side area 28 and the radiation coupling-out area 27 to one another. As a result, protection of the laser diode chip 2 and in particular the semiconductor layers thereof and the interfaces between the semiconductor layers can be achieved on all sides, since all side areas of the laser diode chip 2 are covered with the crystalline protective layer 6. In this case, as shown in FIG. 16, the crystalline protective layer 6 can be applied over the optical layers 7. As an alternative thereto, it is also possible to apply the crystalline protective layer 6 directly on the radiation coupling-out area and/or the rear side area 28.

The following figures show further exemplary embodiments of laser diode assemblies which exhibit modifications and variations of the exemplary embodiments described in conjunction with FIGS. 2A, 2B, 3 and 5A to 5G. Therefore, the following description is restricted essentially to the differences with respect to the previous exemplary embodiments. In particular, the laser diode assemblies described below can have a crystalline protective layer at least on the radiation coupling-out area, and a housing cover, even if these are not explicitly shown in the following figures.

Figure 6:
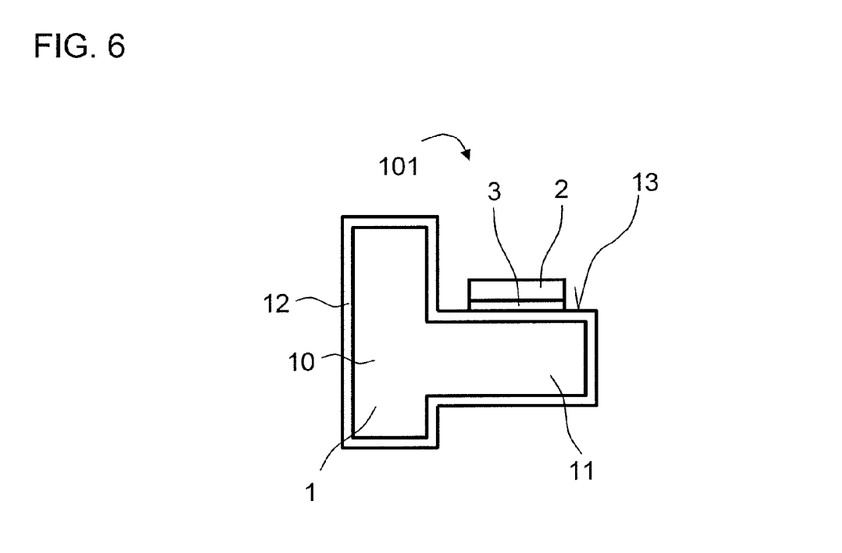

FIG. 6 shows an exemplary embodiment of a laser diode assembly 101 wherein, in comparison with the laser diode assembly 100 in accordance with FIGS. 2A and 2B, not only the housing part 10 but also the mounting part 11 has a sheathing 12 composed of steel. As a result, as in the case of a standard TO housing, it is possible to achieve a mounting area 13 composed of steel, while the thermal conductivity improved by the copper can be obtained at the same time.

Figure 7A:
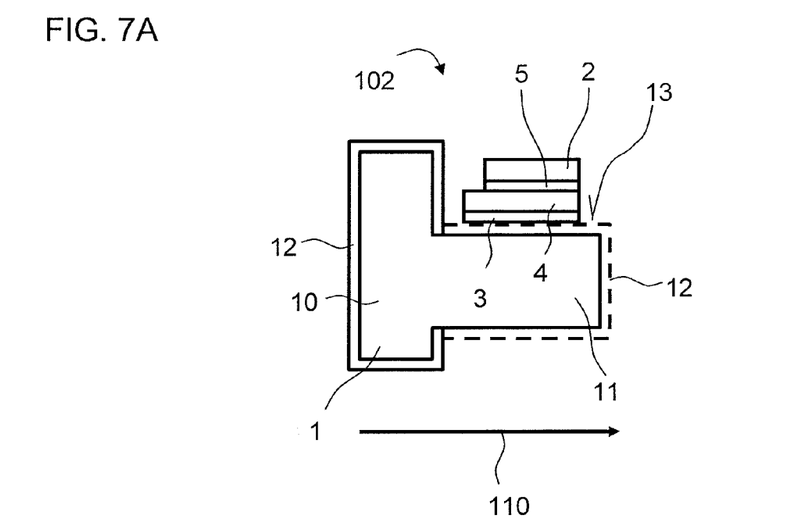
Figure 7B:
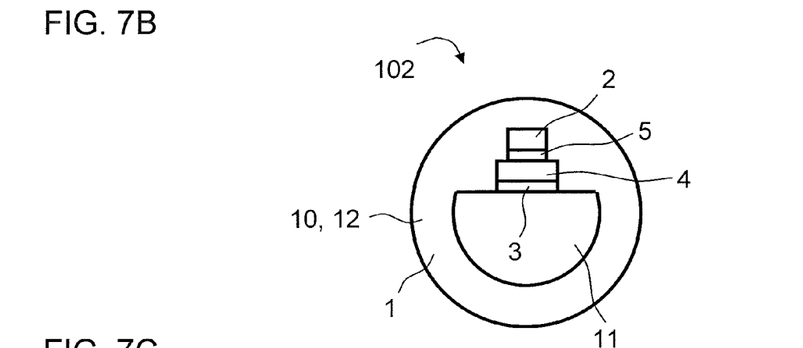
Figure 7C:
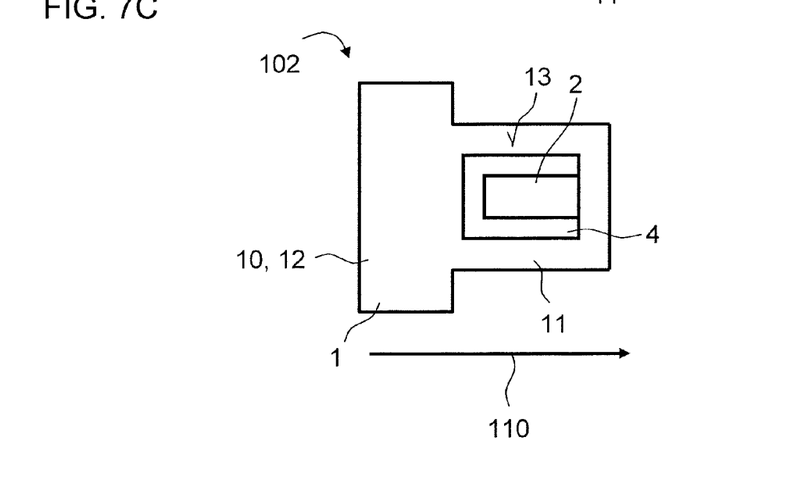

FIGS. 7A to 7C show a laser diode assembly 102 in accordance with a further exemplary embodiment in a schematic sectional illustration (FIG. 7A), in a plan view counter to the extension direction 110 (FIG. 7B) and in a plan view of the mounting area 13 (FIG. 7C). In comparison with the previous exemplary embodiments, in the case of the laser diode assembly 102, a heat-conducting element 4 is arranged between the laser diode chip 2 and the mounting part 11 of the housing 1. The heat-conducting element is embodied, in particular, as a so-called heat spreader and serves to expand the heat flow between the laser diode chip 2 and the mounting part 11 of the housing 1 in order to achieve the largest possible transition area during heat transfer into the housing 1.

In this case, as described above, the first solder layer 3, by means of which the heat-conducting element 4 is mounted on the mounting part 11 of the housing 1, can be embodied with a thickness of greater than or equal to 2 μm, preferably of greater than or equal to 3 μm and particularly preferably of greater than or equal to 5 μm. Furthermore, a second solder layer 5 is arranged between the heat-conducting element 4 and the laser diode chip 2, the laser diode chip 2 being mounted on the heat-conducting element 4 by means of said second solder layer. The second solder layer 5 can preferably likewise have a thickness of greater than or equal to 2 μm, preferably of greater than or equal to 3 μm and particularly preferably of greater than or equal to 5 μm. As an alternative thereto, it is also possible for only one of the two solder layers 3, 5 to have such a large thickness, for example, only the first solder layer 3.

The mounting part 11 can be formed by copper, as shown in the exemplary embodiment shown, or can also have a steel sheathing 12, as described in conjunction with FIG. 6 and indicated by the dashed line in FIG. 7A.

The laser diode chip 2 and the housing 1 have different coefficients of thermal expansion on account of the different materials. Usually, nitride-based semiconductor materials have a coefficient of thermal expansion of approximately $5.6 \times 10{-}6$ 1/K and a thermal conductivity of approximately 100 W/mK, while copper has a coefficient of thermal expansion of approximately $16 \ldots 18 \times 10^{-6}$ 1/K and a thermal conductivity of approximately 300 W/mK. Situated therebetween are a plurality of materials having likewise different coefficients of thermal expansion, thus, for example, a steel sheathing 12 of the mounting part 11, the solder layers 3 and 5 and the heat-conducting element 4. Steel has a coefficient of thermal expansion of approximately $6 \ldots 12 \times 10^{-6}$ 1/K and a thermal conductivity of approximately 30 . . . 70 W/mK. The heat-conducting element 4 can comprise AlN, for example, or be composed thereof, AlN having a coefficient of thermal expansion of approximately $4.5 \ldots 5.7 \times 10^{-6}$ 1/K and a thermal conductivity of approximately 80 . . . 200 W/mK. The coefficient of thermal expansion of an AlN heat-conducting element 4 is thus matched relatively well to the coefficient of thermal expansion of the laser diode chip 2. At the boundary transition between the AlN heat-conducting element 4 with respect to the housing 1, that is to say either with respect to copper or with respect to steel-sheathed copper, there is, however, a significant difference in the coefficients of thermal expansion.

Particularly preferably, therefore, as material for the heat-conducting element 4, instead of AlN, it is possible to use SiC, in particular 6H-SiC, which, although it has a coefficient of thermal expansion of approximately $4.4 \times 10^{-6}$ 1/K, has a higher thermal conductivity of approximately 200 . . . 500 W/mK. As an alternative thereto, as heat-conducting element 4 it is also possible to use one of the following materials: CuW having a coefficient of thermal expansion of approximately $6 \ldots 8 \times 10^{-6}$ 1/K and a thermal conductivity of approximately 200 . . . 250 W/mK, BN having a coefficient of thermal expansion of approximately $2.5 \ldots 4 \times 10^{-6}$ 1/K and a thermal conductivity of approximately 600 W/mK, diamond, for example, diamond produced by means of CVD, which has an even higher thermal conductivity of approximately 1000 W/mK in conjunction with a coefficient of thermal expansion of $2.3 \times 10^{-6}$ 1/K. Although such materials for the heat-conducting element 4 are rather unfavorable with regard to a thermal strain, they can preferably be used in the laser diode assembly described here since the greater thermal strains brought about by these materials can be compensated for by the thick solder layers 3, 5 described here. The solder layers 3, 5 can comprise an indium-based soft solder, for example, in order to enable the best possible compensation of the thermally induced strains.

The features described and shown in the Figures and exemplary embodiments can be combined with one another in accordance with further exemplary embodiments, even if such combinations are not explicitly shown in the figures. In particular, the different housing forms, the use of a heat-conducting element 4 and also the arrangement of one or more protective layers 6 on the laser diode chip 2 can be combined with one another. Furthermore, the exemplary embodiments shown in the figures can also have alternative or additional features in accordance with the embodiments in the general part.

In the case of the laser diode assembly described here, the use of the housing 1 based on copper, on account of the different coefficients of thermal expansion of the individual elements of the laser diode assembly, can lead to thermally induced strains, for example, between the housing 1 and a heat-conducting element 4, between the heat-conducting element 4 and the laser diode chip 2 or, in the absence of a heat-conducting element 4, directly between the laser diode chip 2 and the housing 1. Moreover, during the process for producing the housing parts, on account of the different material compositions, surface unevennesses can occur, in particular in the case of a steel-sheathed mounting part 11. Without the additional measures described here for the laser diode assembly, the advantage of the copper-based housing 1 could therefore be lost again as a result of reduced heat removal between the laser diode chip 2 and the housing 1 or, if appropriate, a heat-conducting element 4 and the housing 1. A stable coupling of the laser diode chip 2 or of the heat-conducting element 4 to the housing 1 can be achieved by means of the first solder layer 3 having a thickness of more than 2 μm and preferably more than 3 μm. In order to combat the risk—which exists as a result of the increased supply of solder—that solder particles can migrate via the surfaces of the laser diode chip 2, in particular the laser facets 27, 28, and diffuse through the facet coating, which would lead to leakage currents via the laser facets 27, 28, the laser diode chip 2 preferably has the crystalline protective layer 6. By means of the crystalline protective layer 6, it is additionally possible to achieve a significant increase in the breakdown field strength. As a result, it is possible to achieve protection against electrical breakdown, for example, on account of a solder layer running up or a p-type metallization hanging over a facet.

In the case of the laser diode assembly described here in accordance with the exemplary embodiments shown, the high thermal conductivity of the housing 1, a good thermal linking of the laser diode chip 2 and, if appropriate, of a heat-conducting element 4 to the housing 1, protection of the radiation coupling-out area 27 against environmental influences and solder particles and a high breakdown strength of the coating of the radiation coupling-out area 27 are therefore combined with one another, as a result of which it is possible to obtain an increase in the optical output power in comparison with known laser diode components.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. A laser diode assembly, comprising:
   a housing having a housing part and having a mounting part that is connected to the housing part and that extends away from the housing part along an extension direction, wherein the housing part and the mounting part have a main body composed of copper and wherein the housing part is steel-sheathed;
   a laser diode chip on the mounting part, the laser diode chip having semiconductor layers on a substrate, the semiconductor layers including an active layer for emitting light;
   a first solder layer having a thickness of greater than or equal to 2 μm arranged between the laser diode chip and the mounting part; and
   a crystalline protective layer, wherein the laser diode chip has a radiation coupling-out area on which the crystalline protective layer is applied.

2. The laser diode assembly according to claim 1, wherein the crystalline protective layer comprises a dielectric material.

3. The laser diode assembly according to claim 1, wherein the crystalline protective layer comprises an oxide.

4. The laser diode assembly according to claim 1, wherein the crystalline protective layer comprises a plurality of crystalline layers.

5. The laser diode assembly according to claim 1, further comprising an optical layer applied on the radiation coupling-out area.

6. The laser diode assembly according to claim 5, wherein the optical layer is arranged between the radiation coupling-out area and the crystalline protective layer and is covered by the crystalline protective layer.

7. The laser diode assembly according to claim 5, wherein the crystalline protective layer is arranged between the radiation coupling-out area and the optical layer.

8. The laser diode assembly according to claim 1, wherein and optical layer is applied on the radiation coupling-out area, the optical layer being formed by the crystalline protective layer.

9. The laser diode assembly according to claim 1, wherein a crystalline protective layer is applied on a rear side area of the laser diode chip, the rear side area being situated opposite the radiation coupling-out area.

10. The laser diode assembly according to claim 1, wherein a crystalline protective layer is applied on side areas of the laser diode chip that connect a rear side area and the radiation coupling-out area, the rear side area being situated opposite the radiation coupling-out area.

11. The laser diode assembly according to claim 1, wherein the thickness of the first solder layer is greater than or equal to 3 μm.

12. The laser diode assembly according to claim 1, further comprising a heat-conducting element arranged between the laser diode chip and the mounting part.

13. The laser diode assembly according to claim 12, wherein the heat-conducting element is fixed on the mounting part by the first solder layer and the laser diode chip is fixed on the heat-conducting element by a second solder layer.

14. The laser diode assembly according to claim 13, wherein the second solder layer has a thickness of greater than or equal to 2 μm.

15. The laser diode assembly according to claim 12, wherein the heat-conducting element comprises AlN, SiC, BN, CuW or diamond.

16. The laser diode assembly according to claim 1, further comprising a housing cover applied on the housing part, the housing cover being welded to the housing part.

17. The laser diode assembly according to claim 16, wherein the mounting part projects into the housing cover from the housing part along the extension direction.

* * * * *